(12) United States Patent
Tamatsuka et al.

(10) Patent No.: US 6,191,009 B1
(45) Date of Patent: Feb. 20, 2001

(54) METHOD FOR PRODUCING SILICON SINGLE CRYSTAL WAFER AND SILICON SINGLE CRYSTAL WAFER

(75) Inventors: Masaro Tamatsuka; Makoto Iida; Norihiro Kobayashi, all of Gunma-ken (JP)

(73) Assignee: Shin-Etsu Handotai Co., Ltd., Tokyo (JP)

( * ) Notice: Under 35 U.S.C. 154(b), the term of this patent shall be extended for 0 days.

(21) Appl. No.: 09/264,514

(22) Filed: Mar. 8, 1999

(30) Foreign Application Priority Data

Mar. 9, 1998 (JP) .................................................. 10-74868
Nov. 17, 1998 (JP) ................................................ 10-343612

(51) Int. Cl.$^7$ ................................................. H01L 21/322
(52) U.S. Cl. ........................................... 438/471; 148/33
(58) Field of Search ..................................... 438/471, 473, 438/477, 974; 117/13, 19; 148/33

(56) References Cited

U.S. PATENT DOCUMENTS

| 5,574,307 | 11/1996 | Kageyama et al. . | |
|---|---|---|---|
| 6,059,875 | * 5/2000 | Kirkland et al. ........................ | 117/13 |

FOREIGN PATENT DOCUMENTS

| 0170788A1 | 2/1986 | (EP) | ............................... C30B/15/04 |
|---|---|---|---|
| 0716168A1 | 6/1996 | (EP) | ............................... C30B/15/14 |
| 0829559A1 | 3/1998 | (EP) | ............................... C30B/13/28 |
| 60-251190 | 12/1985 | (JP) | ............................... C30B/15/04 |
| 2267195 | 10/1990 | (JP) | ............................... C30B/29/06 |
| 4192345 | 7/1992 | (JP) | ............................... H01L/21/66 |
| 05294780 | 11/1993 | (JP) | ............................... C30B/15/02 |

OTHER PUBLICATIONS

F. Shimura et al., "Nitrogen Effet on Oxygen Precipitation in Czochralski Silicon", Appl. Phys. Lett., 48, No. 3, pp. 224–226, Jan. 1986.*

Shimura, et al., "Nitrogen Effect on Oxygen Precipitation in Czochralski Silicon," Applied Physics Letters., vol. 48, No. 3, 1986, pp. 224–226, New York, US.

Watanabe, et al., "Controlled Oxygen Doping in Silicon," 14th International Conference on Solid State Device and Materials, Japanese Journal of Applied Physics Supplement 22–1, vol. 22, No. 22–1, 1983, pp. 185–189, Tokyo, Japan.

Hara, et al., "Enhancement of Oxygen Precipitation in Quenched Czochralski Silicon Crystals," Journal of Applied Physics, vol. 66, No. 8, Oct. 15, 1989, pp. 3958–3960.

* cited by examiner

*Primary Examiner*—Charles Bowers
*Assistant Examiner*—Keith Christianson
(74) *Attorney, Agent, or Firm*—Hogan & Hartson, LLP.

(57) ABSTRACT

In a method for producing a silicon single crystal wafer, a silicon single crystal ingot in which nitrogen is doped is grown by a Czochralski method, sliced to provide a silicon single crystal wafer, and then subjected to heat treatment to out-diffuse nitrogen on the surface of the wafer. According to a further method, a silicon single crystal ingot is grown in which nitrogen is doped by a Czochralski method, with controlling nitrogen concentration, oxygen concentration and cooling rate, and then the silicon single crystal ingot is sliced to provide a wafer. A silicon single crystal wafer is obtained by slicing a silicon single crystal ingot grown by a Czochralski method with doping nitrogen, wherein the depth of a denuded zone after gettering heat treatment or device fabricating heat treatment is 2 to 12 $\mu$m, and the bulk micro-defect density after gettering heat treatment or device fabricating heat treatment is $1 \times 10^8$ to $2 \times 10^{10}$ number/cm$^3$. A CZ silicon wafer is provided, wherein generation of crystal defects on the surface of the wafer, and oxygen precipitation, is accelerated in the bulk portion of the wafer. The controllable range of the depth of the denuded zone and the bulk micro-defect density can be enlarged.

19 Claims, 4 Drawing Sheets

■ NITROGEN CONCENTRAION $3 \times 10^{14}$ atoms/cm$^3$, COOLING RATE 2.3°C/min
◆ NITROGEN CONCENTRAION $3 \times 10^{14}$ atoms/cm$^3$, COOLING RATE 3.5°C/min
▲ NITROGEN CONCENTRAION $3 \times 10^{13}$ atoms/cm$^3$, COOLING RATE 2.3°C/min
▼ NITROGEN CONCENTRAION $3 \times 10^{13}$ atoms/cm$^3$, COOLING RATE 3.5°C/min
× NITROGEN CONCENTRAION $2 \times 10^{12}$ atoms/cm$^3$, COOLING RATE 3.5°C/min
○ WITHOUT DOPING NITROGEN, COOLING RATE 2.3°C/min
● WITHOUT DOPING NITROGEN, COOLING RATE 3.5°C/min

FIG. 4(a)

SURFACE OF WAFER

INSIDE OF WAFER

○ ◇ CRYSTAL DEFECT
● OXIDE PRECIPITATE

FIG. 4(b)

SURFACE OF WAFER

INSIDE OF WAFER

○ ○ ◇ CRYSTAL DEFECT
● OXIDE PRECIPITATE

METHOD FOR PRODUCING SILICON SINGLE CRYSTAL WAFER AND SILICON SINGLE CRYSTAL WAFER

BACKGROUND OF THE INVENTION

1. Field of the Invention

The present invention relates to a method for producing a silicon single crystal wafer in high productivity wherein a size of crystal defect inside the crystal, called grown-in defect, is decreased by doping nitrogen when pulling a silicon single crystal by a Czochralski method (hereinafter referred to as "CZ method"), and gettering ability is improved by subjecting the wafer to heat treatment, and the silicon single crystal wafer produced by the method.

2. Description of the Related Art

As a wafer for fabrication of a device such as a semiconductor integrated circuit, a silicon single crystal wafer grown by a Czochralski method (CZ method) is mainly used. If crystal defects are present in such a silicon single crystal wafer, pattern failure is caused when a semiconductor device is fabricated. Particularly, the pattern width of devices which is highly integrated in recent years is very fine as 0.35 $\mu$m or less. Accordingly, even small crystal defects as 0.1 $\mu$m may cause defects such as pattern failures in the device, and may remarkably lower a yield and characteristics of the device. Accordingly, the crystal defects in the silicon single crystal wafer have to be decreased as thoroughly as possible.

Recently, it has been reported that the above-mentioned crystal defects called grown-in defect incorporated during growth of the crystal are found in the silicon single crystal grown by CZ method by various measurement methods. For example, these crystal defects in a single crystal grown at a general growth rate in commercial production (for example, about 1 mm/min or more) can be detected as a pit by subjecting the surface of the crystal to preferential etching (Secco etching) with Secco solution (a mixture of $K_2Cr_2O_7$, hydrofluoric acid and water) (See Japanese Patent Application Laid-open (kokai) No. 4-192345).

The main cause of generation of such a crystal defect is considered to be a cluster of vacancies which are aggregated during manufacture of single crystal or an oxide precipitate which is an agglomerate of oxygen atoms getting in from a quartz crucible. When these crystal defects are present in the surface portion in which a device is fabricated, they come to harmful defect to degrade characteristics of the device. Accordingly, it is desirable to reduce these crystal defects to produce the wafer having a sufficiently deep denuded zone (DZ) in the surface layer.

When heavy metal impurity such as Fe, Cu or the like is present in the surface portion of the silicon single crystal wafer, the characteristics of the device may be degraded during fabrication thereof. Accordingly, it is important to remove heavy metal impurity by intrinsic gettering (IG) wherein the bulk micro-defects are precipitated as a gettering site in a bulk portion of the silicon wafer. It is necessary to generate the bulk micro-defects (BMD) in sufficient density in the bulk portion of the wafer in order to make the intrinsic gettering effective.

The bulk micro-defect used herein means micro-defects such as oxide precipitates, dislocation, stacking fault or the like induced by oxide precipitates, which are present in the bulk portion.

From the above-mentioned points of view, for manufacture of silicon semiconductor wafer, the depth of denuded zone in the surface part of the wafer in which a device is fabricated and the density of bulk micro-defects in the bulk portion of the wafer which is to be a gettering site after gettering heat treatment or device process heat treatments are important.

It has been known that the depth of denuded zone and the density of bulk micro-defects depend on interstitial oxygen concentration in the silicon single crystal grown by CZ method or cooling rate (growth rate) during growth of silicon single crystal. Accordingly, the depth of denuded zone and the bulk micro-defect density of the silicon wafer have been controlled mainly by controlling oxygen concentration and cooling rate.

For example, it is known that a density of the above-mentioned cluster of vacancies can be lowered by decreasing a growth rate of the crystal extremely (for example, to 0.4 mm/min or less) (See Japanese Patent Application Laid-open (kokai) No.2-267195). However, adopting this method there is generated a crystal defect which is considered to be a dislocation loop formed as a result of new aggregation of excess interstitial silicon atoms, which may degrade characteristics of a device significantly. Accordingly, the problem cannot be solved by the method. Furthermore, productivity of the single crystal and cost performance are extremely decreased in the method, since the growth rate of the crystal is decreased from about 1.0 mm/min as usual or more to 0.4 mm/min or less.

In order to reduce crystal defects due to oxide precipitate in the surface portion of the wafer, there is a method of growing crystal with lowering initial oxygen concentration in the crystal. However, in the method, oxygen concentration, and amount of precipitated oxygen are lowered not only in the surface portion in which the device is fabricated, but also in the bulk of the wafer. When amount of precipitated oxygen is lowered in the bulk portion, intrinsic gettering (IG) effect wherein harmful heavy metal or the like is captured in device process cannot be achieved, resulting in lowering a yield in device fabrication.

Furthermore, in the silicon single crystal wafer obtained from the silicon single crystal ingot grown by such a method wherein oxygen concentration and cooling rate are controlled, the size of crystal defect such as grown-in defect or the like is large, and thus it cannot be eliminated sufficiently by a gettering heat treatment conducted thereafter. As a result, the depth of denuded zone of conventional silicon single crystal wafer gets shallow as 0.5 $\mu$m at most.

In the conventional method, although the density of bulk micro-defect after heat treatment of the wafer having high oxygen concentration as 20 ppma (JEIDA) is about $1\times10^{10}$ number/$cm^3$(defect/$cm^3$), which results crystal defects due to oxygen remain near the surface, resulting in lowering of yield of the device. Furthermore, the density of bulk micro-defect after heat treatment of the wafer having oxygen concentration of 9 to 17 ppma (JEIDA) which is generally used for the device is about $1\times10^9$ number/$cm^3$ at most, which is insufficient to make intrinsic gettering effective. Accordingly, there is a problem of lowering of device yield due to heavy metal impurity on the surface of the wafer.

SUMMARY OF THE INVENTION

The present invention has been accomplished to solve the above-mentioned problems, and an object of the present invention is to suppress growth of crystal defects (grown-in defects) in the silicon single crystal wafer produced by CZ method, especially to reduce a number of crystal defects in the surface layer, and accelerate oxygen precipitation in the bulk portion of the wafer, and thereby enlarge the controllable range of the depth of denuded zone and the bulk micro-defect density significantly, and to provide a method for producing a silicon single crystal wafer with which sufficient IG effect in high productivity and easily by CZ method.

In the specification of the present invention, two terms are used to define interstitial oxygen concentration. The relation thereof are as follows.

JEIDA (ppma)×0.8×10$^{17}$=ASTM'79 (atoms/cm$^3$)

To achieve the above object, the present invention provides a method for producing a silicon single crystal wafer wherein a silicon single crystal ingot in which nitrogen is doped is grown by Czochralski method, the single crystal ingot is sliced to provide a silicon single crystal wafer, and then the silicon single crystal wafer is subjected to heat treatment to out-diffuse nitrogen on the surface of the wafer.

As mentioned above, growth of crystal defects incorporated during growth of a single crystal can be suppressed by doping nitrogen when a single crystal ingot is grown by CZ method. Furthermore, since the growth rate of crystal can be increased as a result of suppression of growth of the crystal defects, productivity of the crystal can be significantly improved.

When the wafer processed from the silicon single crystal in which nitrogen is doped as mentioned above is subjected to a heat treatment to out-diffuse nitrogen in the surface layer of the wafer, very few defects are present in the surface layer of the wafer, and nitrogen is out-diffused, and therefore the fabricated device is not adversely affected. When oxygen is also out-diffused by the heat treatment, the density of defects on the surface can be further improved. In the bulk portion of the wafer, oxygen precipitation is accelerated by the presence of nitrogen, so that the wafer having sufficient IG effect can be produced.

When a silicon single crystal ingot in which nitrogen is doped is grown by Czochralski method, concentration of doped nitrogen is preferably 1×10$^{10}$~5×10$^{15}$ atoms/cm$^3$.

Because, nitrogen concentration of 1×10$^{10}$ atoms/cm$^3$ or more is preferable for sufficient suppression of growth of crystal defects, and nitrogen concentration of 5×10$^{15}$ atoms/cm$^3$ or less is preferable in order not to impede formation of silicon single crystal.

When a silicon single crystal ingot wherein nitrogen is doped is grown by Czochralski method, oxygen concentration in the single crystal ingot is preferably 1.2×10$^{18}$ atoms/cm$^3$ (value according to ASTM'79 (15 ppma: JEIDA value)) or less.

As described above, lower oxygen concentration can further suppress growth of crystal defect, and prevent formation of oxide precipitates in the surface layer. In the bulk portion, oxygen precipitation is accelerated due to presence of nitrogen, and thus sufficient IG effect can be achieved even when oxygen concentration is low.

In an embodiment of the present invention, the heat treatment for out-diffusing nitrogen on the surface of the wafer is conducted at a temperature of 900° C. to a melting point.

When the heat treatment is conducted at a temperature in the above-mentioned range, nitrogen in the surface layer can be out-diffused sufficiently, and also oxygen can be out-diffused at the same time, and thereby crystal defect in the surface layer can be extremely reduced. In the bulk portion, oxide precipitate can be grown by heat treatment, so that an ideal wafer having IG effect can be provided.

In another embodiment, the heat treatment for out-diffusing nitrogen on the surface of the wafer is preferably conducted in an atmosphere of oxygen, hydrogen, argon or a mixed atmosphere thereof.

When conducting the heat treatment in such an atmosphere, nitrogen can be effectively out-diffused without forming a surface coating film which is harmful for a silicon wafer.

Example of the heat treatment for out-diffusing nitrogen include: gettering heat treatment and/or device fabricating heat treatment. They do not have to be conducted only for the purpose of out-diffusing nitrogen.

The present invention also relates to a method of producing a silicon single crystal wafer wherein a silicon single crystal ingot in which nitrogen is doped is grown by Czochralski method with controlling nitrogen concentration, oxygen concentration and cooling rate, and then the silicon single crystal ingot is sliced to provide a wafer.

Controlling not only oxygen concentration and cooling rate but also nitrogen doping amount as mentioned above, controllable range of the depth of denuded zone and the bulk micro-defect density are significantly enlarged so that it will be possible to produce a silicon single crystal wafer with high quality that the depth of denuded zone is 2 to 12 µm, and the bulk micro-defect density is 1×10$^8$ to 2×10$^{10}$ number/cm$^3$.

In that case, the concentration of doped nitrogen in a single crystal ingot grown by CZ method is preferably controlled to be 1×10$^{12}$ to 1×10$^{15}$ atoms/cm$^3$, the oxygen concentration contained in the single crystal ingot is preferably controlled to be in the range of 9 to 17 ppma (JEIDA), and the rate of cooling from 1150° C. to 1080° C. is preferably controlled to be in the range of from 1.0 to 4.5° C./min.

When the nitrogen concentration, the oxygen concentration and the cooling rate are controlled to be in the above-mentioned range while silicon single crystal ingot in which nitrogen is doped is grown as mentioned above, there can be produced a silicon single crystal wafer in which the depth of the denuded zone is surely in the range of from 2 to 12 µm and the bulk micro-defect density is controlled to be in the range of from 1×10$^8$ to 2×10$^{10}$ number/cm$^3$.

The silicon single crystal wafer produced by a method of the present invention is, for example, a silicon single crystal wafer obtained by slicing a silicon single crystal ingot grown by Czochralski method with doping nitrogen wherein nitrogen on the surface of the silicon single crystal wafer is out-diffused by the heat treatment.

In the above silicon single crystal wafer, nitrogen concentration can be 1×10$^{10}$ to 5×10$^{15}$ atoms/cm$^3$, and oxygen concentration can be 1.2×10$^{18}$ atoms/cm$^3$ (ASTM'79) or less.

According to the present invention, the heat treatment for out-diffusing nitrogen can be conducted at a temperature of 900° C. to a melting point, or in an atmosphere of oxygen, hydrogen, argon or a mixed atmosphere thereof.

In the silicon single crystal wafer, very few crystal defects are present in the surface layer, and IG effect in the bulk portion can be sufficient because of oxygen precipitation. Particularly, the density of crystal defects on the surface of the wafer can be 30 number/cm$^2$ or less, so that yield of the device fabrication can be improved significantly.

The silicon single crystal wafer produced by the method of the present invention is, for example, a silicon single crystal wafer produced by slicing the silicon single crystal ingot grown by Czochralski method with doping nitrogen wherein the depth of denuded zone after gettering heat treatment or device fabricating heat treatment can be 2 to 12 µm, and the bulk micro-defect density after gettering heat treatment or device fabricating heat treatment can be $1\times10^8$ to $2\times10^{10}$ number/cm$^3$.

As described above, in the silicon single crystal wafer produced by slicing the silicon single crystal ingot grown by Czochralski method with doping nitrogen, the depth of denuded zone after gettering heat treatment or device fabricating heat treatment can be 2 to 12 μm, and the bulk micro-defect density after gettering heat treatment or device fabricating heat treatment can be $1\times10^8$ to $2\times10^{10}$ number/cm$^3$, namely they can be conducted in the wider range compared to the conventional silicon single crystal, so that there can be the silicon single crystal wafer wherein a region for fabrication of a device is wider and gettering ability is higher.

"Gettering heat treatment" is a generic term for heat treatment conducted after the grown silicon single crystal ingot is processed to the wafer and before a device process. The main purpose of the treatment is elimination of crystal defects near the surface by the above-mentioned out-diffusing of nitrogen on the surface of the wafer and out-diffusing of oxygen impurity. "Device heat treatment" is a generic term for heat treatment conducted in the device fabricating process after the wafer is subjected to gettering heat treatment or the like.

In this case, nitrogen concentration in the above-mentioned silicon single crystal wafer is preferably $1\times10^{12}$ to $1\times10^{15}$ atoms/cm$^3$.

In order to suppress growth of defect by decreasing size of crystal defect, nitrogen concentration is preferably $1\times10^{10}$ atoms/cm$^3$ or more. In order not to prevent monocrystallization, nitrogen concentration is preferably $5\times10^{15}$ atoms/cm$^3$ or less. However, the nitrogen concentration in the range of $1\times10^{12}$ to $1\times10^{15}$ atoms/cm$^3$ is the most effective for prevention of growth of crystal defects, and thus it is possible to decrease size of crystal defect sufficiently, and to make the depth of denuded zone after the gettering heat treatment deep enough, when nitrogen concentration is in the range.

In this case, oxygen concentration of the above-mentioned silicon single crystal wafer is preferably 9 to 17 ppma (JEIDA).

When the oxygen concentration in the silicon single crystal wafer is in this range, growth of crystal defects can be further suppressed, and formation of oxide precipitates in the denuded zone can be prevented. In the bulk portion, oxygen precipitation is accelerated by presence of nitrogen, so that IG effect can be sufficient even at low oxygen concentration as 9 ppma which is the lower limit value of the above-mentioned range.

In this case, it is preferable that the above-mentioned silicon single crystal ingot is the single crystal ingot grown with controlling the rate of cooling from 1150° C. to 1080° C. during growth of the crystal to be in the range of 1.0 to 4.5° C./min.

If the rate of cooling from 1150° C. to 1080° C. during growth of the crystal is in the range of 1.0 to 4.5° C./min, size of crystal defect can be decreased sufficiently, and there can be provided a silicon single crystal wafer wherein the depth of denuded zone is 2 to 12 μm, and the bulk micro-defect density is $1\times10^8$ to $2\times10^{10}$ number/cm$^3$, after gettering heat treatment. As far as the cooling rate is within the above-mentioned range, it is not necessary to decrease growth rate of the silicon single crystal so much that productivity is adversely affected.

According to the present invention, generation of crystal defect in a silicon single crystal produced by CZ method can be suppressed by subjecting a silicon single crystal wafer in which nitrogen is doped to IG heat treatment, so that there can be easily produced in high productivity a silicon single crystal wafer wherein defects in the surface layer of the wafer are very few and oxygen precipitation is accelerated in the bulk portion to impart sufficient IG effect.

Furthermore, the depth of denuded zone after gettering heat treatment in the range of 2 to 12 μm can be achieved by growing silicon single crystal in which nitrogen is doped by Czochralski method, and controlling the nitrogen concentration and the oxygen concentration in the CZ crystal and the cooling rate during growth of the crystal. The bulk micro-defect density after gettering heat treatment or device fabrication can be controlled in a wide range as $1\times10^8$ to $2\times10^{10}$ number/cm$^3$. Accordingly, the silicon single crystal wafer of the present invention has wide device fabricated region and high gettering effect so that industrial value thereof is quite high.

DESCRIPTION OF THE INVENTION AND EMBODIMENT

The present invention will now be described in more detail. However, the invention is not limited thereto.

The inventors have found that a silicon single crystal wafer wherein the amount of crystal defects in a device fabricating layer (the surface layer of the wafer) is small and IG effect is high, can be obtained in high productivity by combining a technology of doping nitrogen while a silicon single crystal is grown by CZ method, and a technology of imparting IG effect to the silicon single crystal wafer by subjecting it to heat treatment, and have accomplished the present invention by studying the conditions.

The present invention has also been accomplished based on the finding that a controllable range of the depth of denuded zone and the bulk micro-defect density can extremely be enlarged by controlling nitrogen concentration in the silicon single crystal in addition to oxygen concentration and cooling rate which are controlled in a conventional method.

Figure 3:
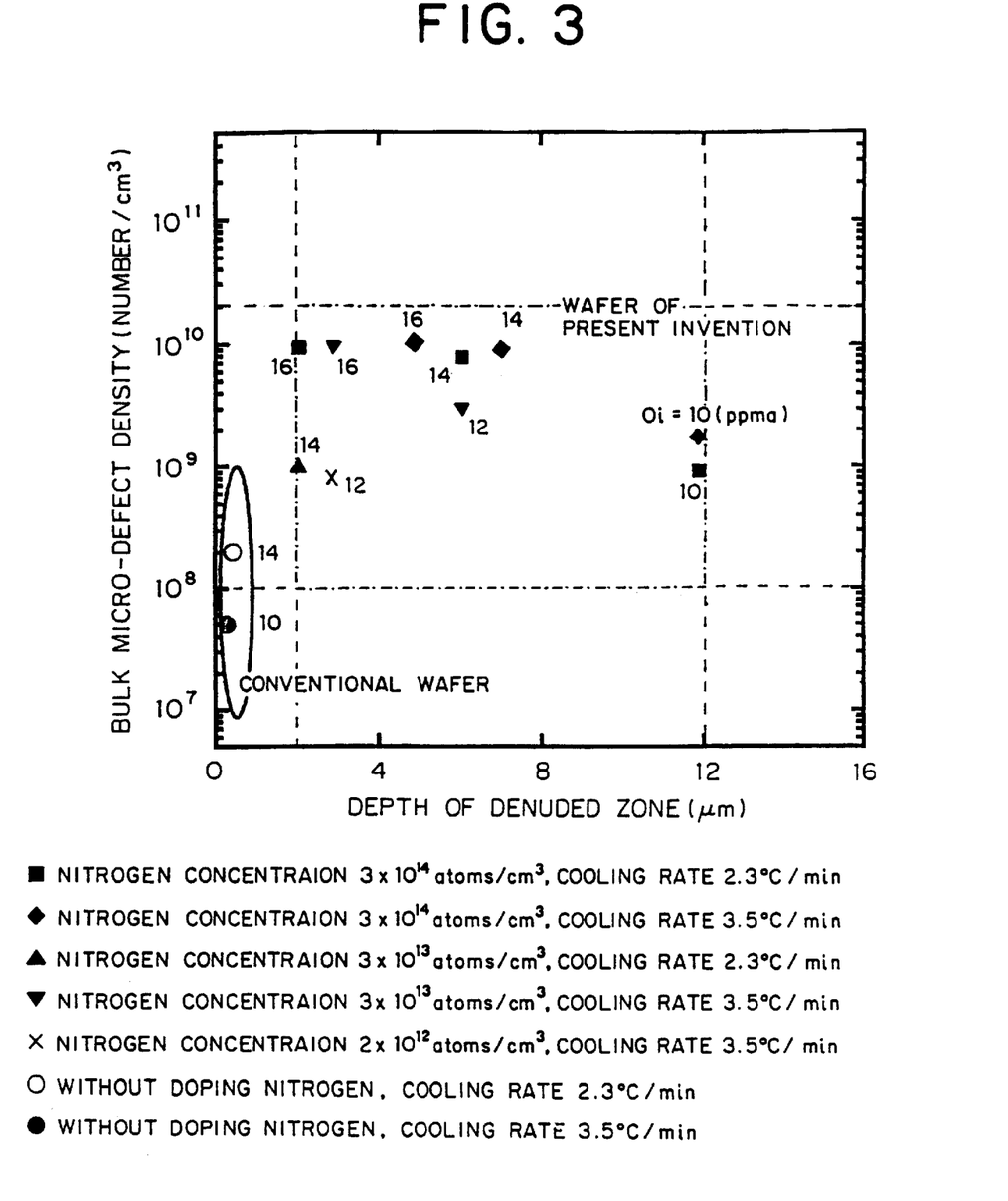
FIG. 3 is a graph showing the depth of denuded zone and the bulk micro-defect density of the silicon single crystal wafers produced with various parameters.

In conventional technique, the depth of denuded zone and the bulk micro-defect density can be controlled only in a quite narrow range. FIG. 3 is a graph showing the depth of denuded zone and the bulk micro-defect density at each value of parameter such as oxygen concentration.

As shown in FIG. 3, it is possible to control the depth of denuded zone only in the narrow range of 0 to 0.5 μm, and the bulk micro-defect density only in the narrow range of $8 \times 10^6$ to $1 \times 10^9$ number/cm$^3$ in the wafer having oxygen concentration of 9 to 17 ppma even when oxygen concentration and cooling rate are varied as in the conventional method.

The cause thereof was found to be in the size of crystal defect, the size of oxide precipitate and the density thereof.

Figure 4A:
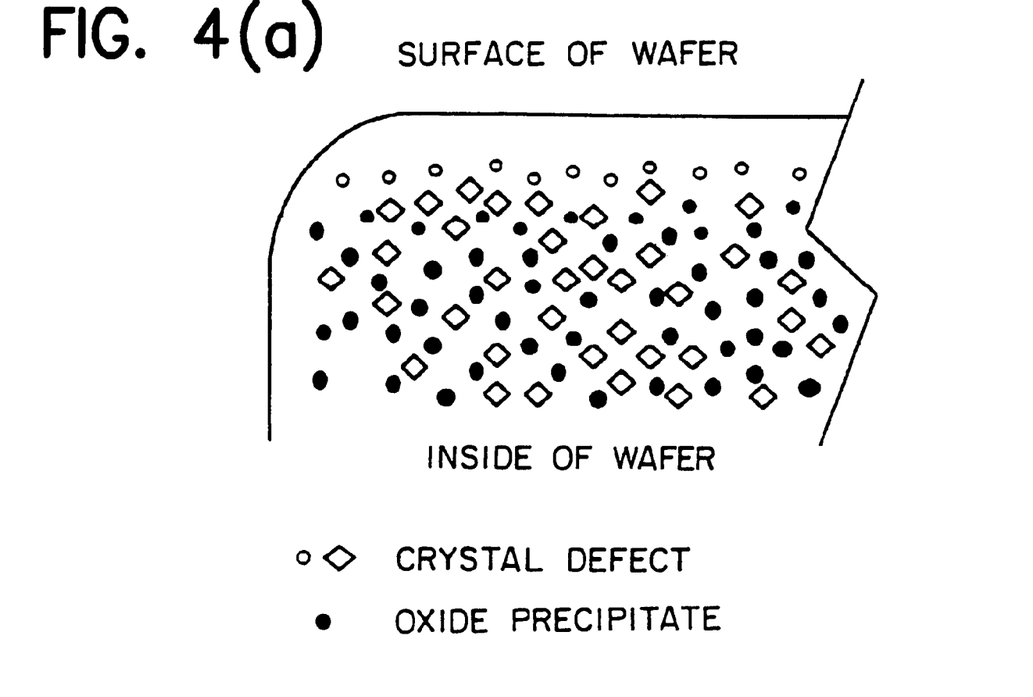
FIG. 4 is a schematic view of crystal defects and oxide precipitates in a silicon single crystal wafer. (a) shows inside of the wafer of the present invention, (b) shows inside of the wafer produced by the conventional method.
Figure 4B:
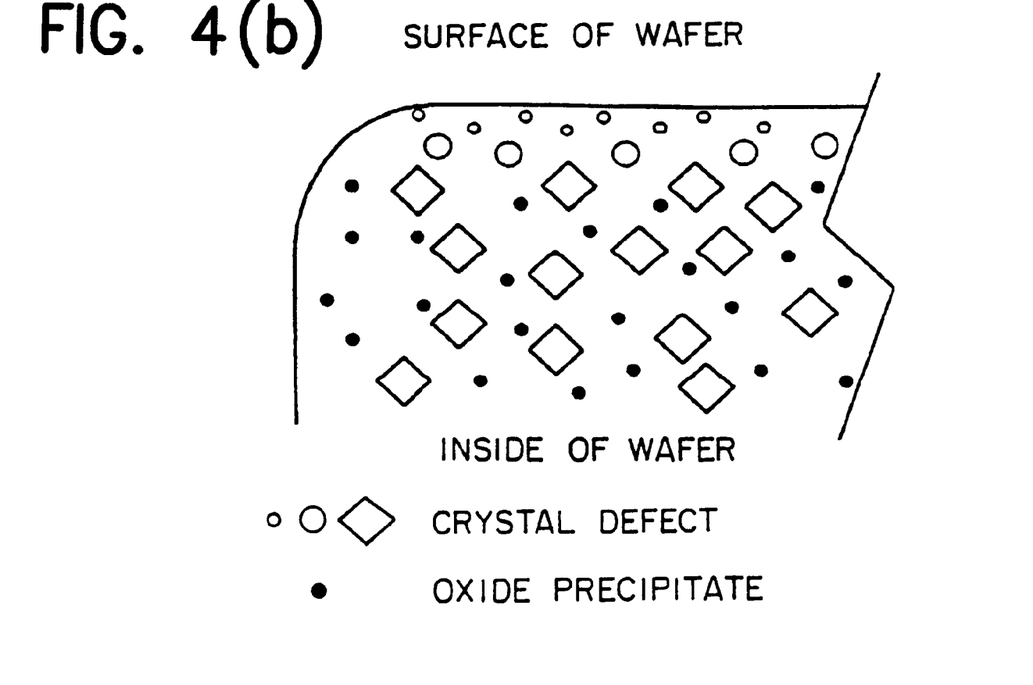

FIGS. 4(a), (b) are schematic views showing crystal defects, oxide precipitates in a silicon single crystal wafer. FIG. 4(b) shows inside of a wafer produced by a conventional method. As shown in FIG. 4(b), in the wafer produced by the conventional method, the density of crystal defect is low, and the number of defect is small, but crystal defects having large size are generated. The crystal defect having a large size cannot be removed sufficiently by the subsequent gettering heat treatment, and makes the denuded zone shallow. Furthermore, in the above-mentioned wafer, the density of oxide precipitate in the bulk portion is low, and a size thereof is small, and therefore gettering ability is low.

The inventors of the present invention have thought of doping nitrogen while a silicon single crystal is grown by Czochralski method, and controlling the amount thereof. The depth of denuded zone and the bulk micro-defect density at each parameter of the silicon single crystal wafer of the present invention are shown in FIG. 3. FIG. 3 shows that it is possible in the wafer of the present invention to control the depth of denuded zone in the wide range as 2 to 12 μm, and the bulk micro-defect density in the wide range as $1 \times 10^8$ to $2 \times 10^{10}$ number/cm$^3$.

FIG. 4(a) shows inside of the wafer of the present invention. As shown in FIG. 4(a), in the wafer produced by the method of the present invention, the size of generated crystal defect is small, although the density of crystal defect is high and the number of defect is large. Such a crystal defect having small size can be easily removed by the subsequent gettering heat treatment or the like. Accordingly, the depth of denuded zone can be significantly increased compared to the conventional wafer.

Furthermore, a large amount of oxide precipitates having large size which are hardly dissolved by the gettering heat treatment are precipitated in the bulk portion of the wafer so that far higher gettering effect can be obtained compared to the conventional wafer.

The silicon single crystal of the present invention has these features because nitrogen is doped therein in an amount controlled adequately. Namely, it is reported that agglomeration of vacancies in the silicon is suppressed when nitrogen is doped in a silicon single crystal so that a size of a crystal defect is decreased (T. Abe and H. Takeno, Mat. Res. Soc. Symp. Proc. Vol. 262, 3, 1992). It is considered that the effect can be achieved with a result that vacancy agglomeration process is transited from homogenous nuclei formation to heterogeneous nuclei formation. Accordingly, the silicon single crystal having very small crystal defect can be obtained by growing a silicon single crystal by CZ method with doping nitrogen, and thus the silicon single crystal wafer having very small crystal defect can be obtained by processing it. According to the method, it is not always necessary to decrease growth rate of crystal, not as in the conventional method, and thus a silicon single crystal wafer can be produced in high productivity.

It is known that a nitrogen atom in the silicon single crystal accelerates oxygen precipitation during the growth of the crystal (for example, in F. Shimura and R. S. Hockett, Appl. Phys. Lett. 48, 224, 1986). Accordingly, the density of oxide precipitate can be increased, and the gettering effect of the silicon single crystal wafer can be improved by doping nitrogen in a proper amount.

However, when nitrogen is doped in the silicon single crystal grown by CZ method, there are caused a lot of defects due to oxygen precipitation such as OSF (oxidation-induced stacking fault) in the device fabricating layer by heat treatment in the device process or the like. Accordingly, CZ silicon single crystal wafer in which nitrogen is doped has not been conventionally used as a wafer for fabrication of the device.

In the present invention, with enjoying an advantage that crystal defect (grown-in defect) hardly grows when nitrogen is doped in the crystal, defects due to accelerated oxygen precipitation can be prevented by out-diffusing nitrogen with heat treatment to succeed in obtaining a silicon single crystal wafer having a very small amount of crystal defects on the surface of the wafer. According to the present invention, oxygen precipitation is accelerated due to nitrogen contained in a bulk portion of the wafer, and thus more precipitates are present in the wafer of the present invention than the ordinary wafer containing no nitrogen and having the same oxygen concentration, and thus IG effect is enhanced. Accordingly, oxygen concentration can be reduced in the present wafer, so that generation of crystal defects on the surface can be further suppressed.

Furthermore, there can be obtained an advantage of high productivity, since it is not necessary to reduce the pulling rate of crystal in CZ method.

The reason why growth of crystal defect generated in silicon can be suppressed by doping nitrogen in silicon single crystal is considered to be that vacancy agglomeration process is transited from homogenous nuclei formation to heterogeneous nuclei formation as described above.

Accordingly, concentration of nitrogen which is doped is preferably $1 \times 10^{10}$ atoms/cm$^3$ or more at which heterogeneous nuclei formation is caused sufficiently. Furthermore, when nitrogen concentration is more than $5 \times 10^{15}$ atom/cm$^3$ which is solid solubility of nitrogen in silicon single crystal, monocrystallization of single crystal may be inhibited. Accordingly, the concentration is controlled so as not to exceed the value.

Furthermore, the inventors of the present invention have further studied the concentration of nitrogen, and found that the most effective nitrogen concentration for controlling the depth of denuded zone and the bulk micro-defect density is in the range of $1 \times 10^{10}$ to $5 \times 10^{15}$ atoms/cm$^3$, especially in the range of $1 \times 10^{12}$ to $1 \times 10^{15}$ atoms/cm$^3$. Because, relatively high concentration of doped nitrogen as in the above-mentioned range makes it possible to control easily the depth of denuded zone and the bulk micro-defect density in the range of the present invention.

Furthermore, the inventors of the present invention have found that it is preferable to control oxygen concentration in the range of 9 to 17 ppma (JEIDA), especially 15 ppma or less, in order to control the above-mentioned depth of denuded zone and the bulk micro-defect density in the range of the present invention. When oxygen concentration is 17 ppma or less, especially 15 ppma or less, harmful oxide precipitate is not formed in the denuded zone in which a device is fabricated after the wafer is processed. When oxygen concentration is 9 ppma or more, problems of shortage of oxide precipitates, lowering of gettering effect or lowering of crystal strength are not caused. Accordingly, oxygen concentration of the silicon single crystal wafer is preferably in the range of 9 to 17 ppma.

Furthermore, the inventors of the present invention have found that it is preferably to control a rate of cooling of from 1150° C. to 1080° C. in the range of 1.0 to 4.5° C./min in order to control the depth of denuded zone and the bulk micro-defect density in the range of the present invention. Because, size of crystal defect is influenced by time of passing through the agglomerating temperature range of vacancies. When the cooling rate is 1.0° C./min or higher, a size of crystal defect can be decreased. When the cooling rate is 4.5° C./min or lower, dislocation-free crystal can be grown. Accordingly, the cooling rate is preferably controlled in the range of 1.0 to 4.5° C./min in order to control the above-mentioned value in the range of the present invention.

In the present invention, a silicon single crystal ingot in which nitrogen is doped can be grown by CZ method according to the known method such as disclosed in, for example, Japanese Patent Application Laid-open (kokai) No 60-251190.

Namely, in CZ method comprising contacting a seed crystal with a melt of polycrystalline silicon raw material contained in a quartz crucible, pulling it with rotating to grow a silicon single crystal ingot having an intended diameter, nitrogen can be doped in a silicon single crystal by placing nitride previously in the quartz crucible, adding nitride into the silicon melt, or by using an atmosphere gas containing nitrogen. A doping amount in the crystal can be controlled by controlling an amount of nitride, concentration or time of introduction of nitrogen gas. For example, nitrogen concentration can be easily controlled in the above-mentioned range of $1 \times 10^{12}$ to $1 \times 10^{15}$ atoms/cm.

As described above, growth of crystal defect introduced during growth of crystal can be suppressed by doping nitrogen while a single crystal ingot is grown by CZ method. Furthermore, it in not necessary to reduce a growth rate of crystal to, for example, 0.4 mm/min or less for suppression of generation of crystal defect, so that productivity of crystal can be improved significantly.

The reason of why growth of crystal defect introduced in silicon can be suppressed is considered to be that vacancy agglomeration process is transited from homogenous nuclei formation to heterogeneous nuclei formation.

Accordingly, concentration of nitrogen which is doped is preferably $1 \times 10^{10}$ atoms/cm$^3$ or more, especially $1 \times 10^{12}$ atoms/cm$^3$ or more. Generation of crystal defect is thereby suppressed sufficiently.

Furthermore, when nitrogen concentration is more than $5 \times 10^{15}$ atom/cm$^3$ which is solid solubility of nitrogen in silicon single crystal, monocrystallization of single crystal is inhibited. Accordingly, the concentration is controlled so as not to exceed the value, especially so as to be $1 \times 10^{15}$ atom/cm$^3$ or less.

When a silicon single crystal ingot in which nitrogen is doped is grown by CZ method in present invention, oxygen concentration contained in a single crystal ingot is preferably controlled in the range of 9 to 17 ppma (JEIDA), especially to be $1.2 \times 10^{18}$ atoms/cm$^3$ (15 ppma:JEIDA) or less.

Oxygen concentration can be lowered so as to fall in the above range by a conventional method, when a silicon single crystal ingot is grown. For example, oxygen concentration can be easily controlled to fall in the above mentioned range by reducing the number of rotation of a crucible, increasing gas volume of flowing, lowering an atmosphere pressure, controlling temperature distribution and convection of a silicon melt or the like.

As mentioned above, a cooling rate during growth of the crystal when growing a silicon single crystal ingot by CZ method in which nitrogen is doped is controlled to be in the range of 1.0 to 4.5° C./min.

The above-mentioned condition of producing crystal can be achieved, for example, by increasing or decreasing growth rate of crystal by controlling pulling rate of crystal. Alternatively, there can be provided an apparatus for cooling the crystal in any cooling rate in a chamber of an apparatus for producing a silicon single crystal by CZ method. Such an apparatus may be an apparatus which cools crystal by spraying a cooling gas thereto, or a water cooled ring which is provided so as to surrounding a crystal at a predetermined position above the melt. In this case, the cooling rate can be controlled in the above-mentioned range by controlling the above-mentioned cooling method and the pulling rate of the crystal.

The silicon single crystal ingot wherein nitrogen is doped in a desirable concentration, oxygen is contained in a desirable concentration and crystal is grown at desirable cooling rate in CZ method can be thus obtained. After it is sliced with a slicing apparatus such as an inner diameter blade slicer, a wire saw or the like, it is subjected to processes such as chamfer, lapping, etching, polishing or the like to be a silicon single crystal wafer. Of course, such processes are merely examples, and other processes such as cleaning or the like can be conducted, and process can be changed appropriately depending on the purpose, namely, order of processes can be changed, and some processes can be omitted.

Then, the silicon single crystal wafer is subjected to, for example, gettering heat treatment and/or device fabricating heat treatment to out-diffuse nitrogen in the surface layer of the wafer.

Out-diffusing of nitrogen on the surface of the wafer is conducted in order to prevent the fabricated device from being adversely affected by oxide precipitated in the device fabricating region in the surface layer of the wafer due to the oxygen precipitation accelerating effect of nitrogen, and defect caused thereby. It can lower defects extremely in the surface layer of the wafer together with the crystal defects suppressing effect of nitrogen during growth of the crystal.

In this case, diffusion rate of nitrogen in silicon is far faster than that of oxygen, nitrogen on the surface can be out-diffused surely by heat treatment.

Specifically, heat treatment for out-diffusing of nitrogen on the surface of the wafer is preferably conducted at a temperature of from 900° C. to a melting point of silicon.

By conducting heat treatment at temperature in the above-mentioned range, nitrogen in the surface layer of the wafer can be out-diffused sufficiently, and oxygen can be out-diffused at the same time, so that generation of defects due to oxide precipitates in the surface layer can be prevented almost completely.

A wafer having IG effect can be obtained since oxide precipitate can be grown in the bulk portion by the above-mentioned heat treatment. Particularly, since oxygen precipitation is accelerated due to presence of nitrogen in the present invention, IG effect is also improved, and thereby sufficient IG effect can be achieved even in the silicon wafer having low oxygen concentration.

The heat treatment at temperature at 900° C. to a melting point of silicon can be conducted in one step or in several steps. It can be conducted in combination with other heat treatment. For example, after the above-mentioned heat treatment at 900° C. to a melting point of silicon, low temperature heat treatment at about 650° C. to 800° C. can be conducted. Oxide precipitate in the bulk portion can be thereby grown so that IG effect can be higher.

The heat treatment for out-diffusing of nitrogen on the surface of the wafer is preferably conducted in an atmosphere of oxygen, hydrogen, argon or a mixed atmosphere thereof.

When the heat treatment is conducted in such an atmosphere, nitrogen can be effectively out-diffused without forming a surface coating film which is harmful to a silicon wafer. Particularly, when the high temperature heat treatment is conducted in a reducing atmosphere such as hydrogen, argon or a mixed atmosphere thereof, crystal defects on the surface of the wafer can be easily eliminated.

As mentioned above, there can be obtained the silicon single crystal wafer grown by CZ method with doping nitrogen of the present invention wherein nitrogen on the surface of the silicon single crystal wafer is out-diffused by heat treatment, the depth of denuded zone is 2 to 12 μm, and the bulk micro-defect density is in the range of from $1 \times 10^8$ to $2 \times 10^{10}$ number/cm$^3$.

Since such a silicon single crystal wafer contains very little crystal defects in the surface layer which is a device fabricating layer, and has deep denuded zone, device can be designed freely. Furthermore, sufficient oxide precipitate is present in the bulk portion so that IG effect can be high. Particularly, since the density of crystal defect on the surface of the wafer can be 30 number/cm$^2$ or less, yield on the device fabrication can be improved significantly.

EXAMPLES

The following examples and comparative examples are being submitted to further explain the present invention. These examples are not intended to limit the scope of the present invention.

Example 1

Comparative Example 1

In accordance with CZ method, 40 kg of polycrystalline material of silicon was charged into a quartz crucible having a diameter of 18 inches, ten single crystal ingots of silicon having a diameter of 6 inches and orientation <100> were pulled, while the pulling rate was varied over the range between 0.8 mm/min and 1.5 mm/min as usual value. Five of them were pulled while silicon wafer having 0.12 g of silicon nitride film is previously charged. Other five of them were pulled without doping nitrogen. The number of rotation of the crucible was controlled so that oxygen concentration in the single crystal is 0.9 to $1.0 \times 10^{18}$ atoms/cm$^3$ (ASTM'79) when pulling any of them.

Nitrogen concentration in the tail part of the crystal ingots in which nitrogen was doped as measured by FT-IR was $5.0 \times 10^{14}$ atoms/cm$^3$ on the average (segregation coefficient of nitrogen is very small, concentration in the body of the crystal ingot will be lower than the value). Oxygen concentration of all crystal ingots as measured by FT-IR was approximately 0.9 to $1.0 \times 10^{18}$ atoms/cm$^3$ in any of them.

The wafers were sliced from the single crystal ingot thus obtained with a wire saw, and subjected to chamfering, lapping, etching, and mirror polishing. All of them were produced in almost the same condition except that nitrogen is doped or not. Two kinds of silicon single crystal mirror polished wafer having a diameter of 6 inches were produced.

The silicon single crystal wafer thus obtained was subjected to Secco etching, pit density was measured by observing the surface thereof with a microscope to determine a density of crystal defect (grown-in defect) existed from the surface to 5 μm in depth.

Figure 1:
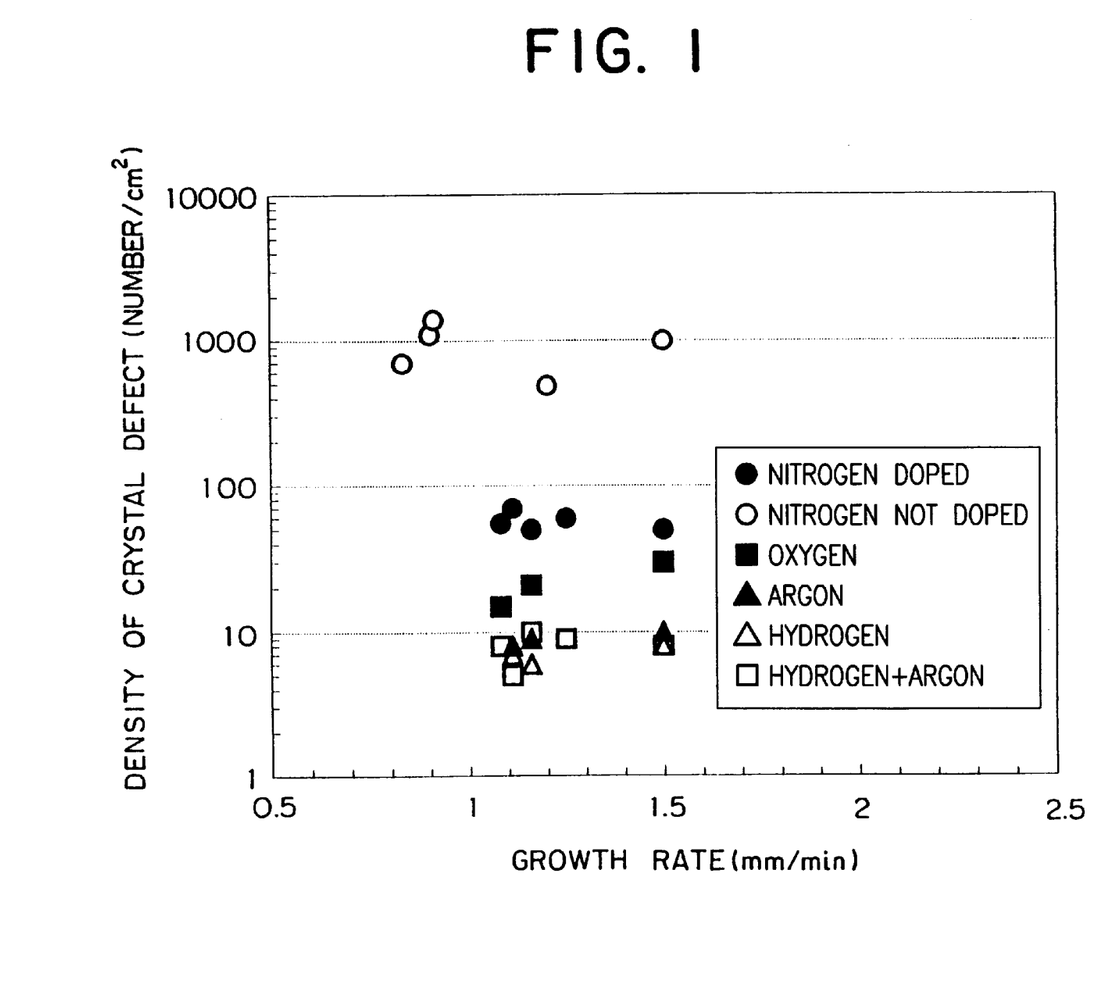
FIG. 1 is a graph showing a result of measurement of a pit density on the surface of the wafer by observing with a microscope after Secco etching in Examples and Comparative Examples, and an effect of heat treatment (black circles show the result of the present method wherein nitrogen is doped, white circles show the results of a conventional method wherein nitrogen is not doped).

The results were shown in FIG. 1. Black circles represent the result as for the method of the present invention. White circles represent the result as for the conventional method.

The result shows that the density of crystal defect of the wafer in which nitrogen was doped obtained by the method of the present invention was decreased to one twentieth of the density of the wafer obtained by the conventional method, even though it was pulled at a pulling rate of 1.0 mm/min or more which is the same as in the conventional method or more. Namely, it is apparent that generation and growth of the crystal defects is suppressed by doping nitrogen.

Then, the wafers were subjected to heat treatment at 1000° C. for 10 hours to out-diffuse nitrogen or oxygen on the surface of the wafer and precipitate oxygen in the bulk portion. It was conducted in an atmosphere of 100% oxygen, 100% argon, 100% hydrogen, or a mixed atmosphere of 50% argon and 50% hydrogen.

The wafer subjected to the above heat treatment was then subjected to Secco etching, and pit density was measured again by observing the surface thereof with a microscope to determine whether density of crystal defect was changed or not.

The results in the case that nitrogen was doped were plotted in FIG. 1.

The result shows that the density of crystal defect on the surface of the wafer in which nitrogen was doped was decreased to about 20 number/cm$^2$ or less by the heat treatment at 1000° C.

Namely, nitrogen and oxygen are out-diffused by the heat treatment so that the crystal defect on the surface of the wafer was eliminated. Particularly, density of crystal defect on the surface of the wafer can be surely lowered to 30 number/cm$^2$ or less.

Then, oxide dielectric breakdown voltage characteristics (C-mode) of the wafer subjected to the above heat treatment was measured.

Oxide dielectric breakdown voltage characteristics (C-mode) was measured under the following condition: thickness of the oxide film: 25 nm, electrode for measurement: phosphorus doped polysilicon, electrode area: 8 mm$^2$, electric current density in decision: 1 mA/cm$^2$.

Generally, the wafer having dielectric breakdown electric field of 8 MV/cm or more is defined as a good chip. The result of measurement was shown in FIG. 2.

Figure 2:
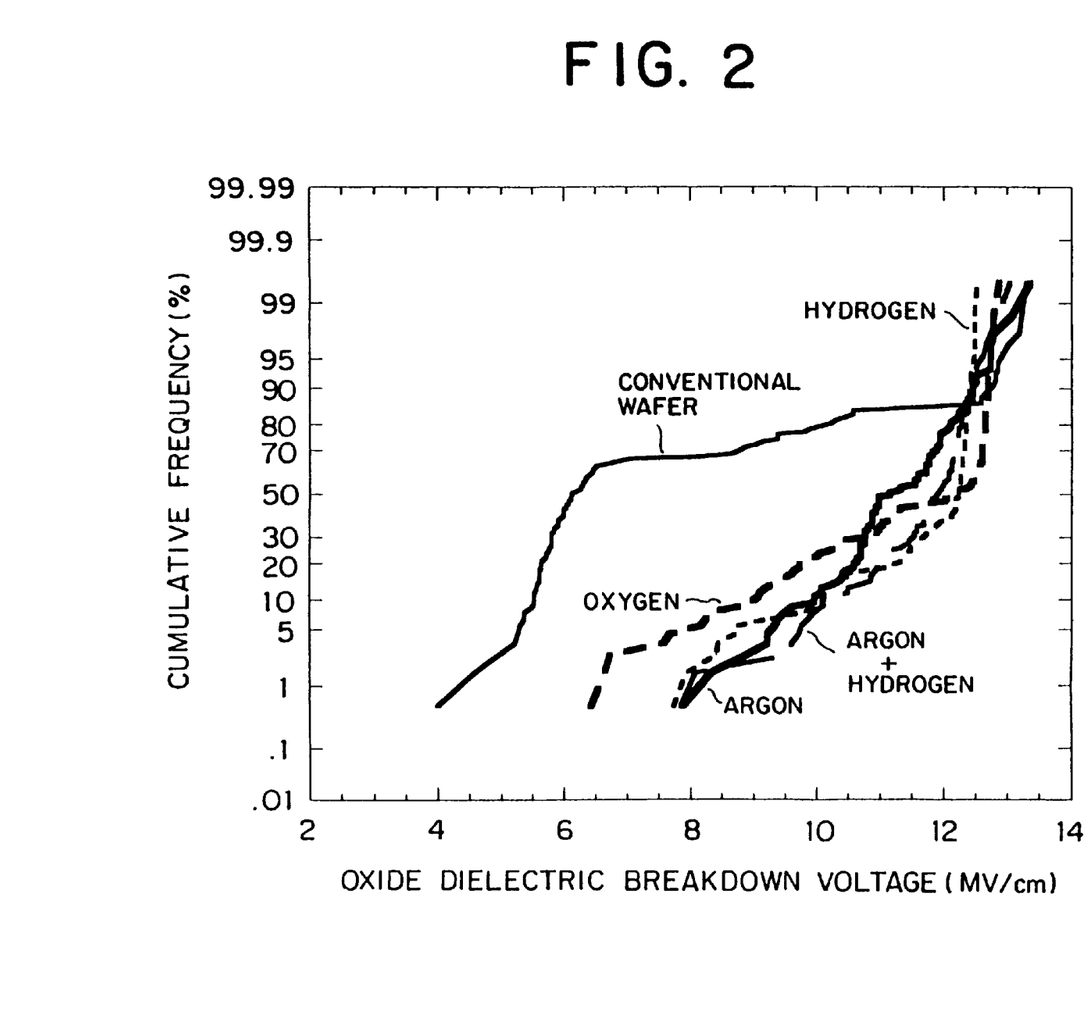
FIG. 2 is a graph showing a result of measurement of oxide dielectric breakdown voltage characteristic (C-mode) of a wafer after heat treatment.

The silicon single crystal wafer of the present invention which contains doped nitrogen and is subjected to the heat treatment, as shown in curved lines A to D, can be good chips having oxide dielectric breakdown voltage of 8 mV/cm or more in high percentage in any heat treatment atmosphere. According to the conventional method, as shown in curved line E, fail chips having oxide dielectric breakdown voltage less than 8 mV/cm are produced in a rate of about 70%.

The wafer subjected to the above heat treatment was then cleaved, and the cleaved surface (the section of the wafer) was subjected to Secco etching, and density of oxide precipitates (pit density) in the bulk portion was measured again by observing the cleaved surface thereof with a microscope.

The pit density of the conventional wafer in which nitrogen is not doped was about $5 \times 10^2$ to $5 \times 10^3$ number/cm$^2$, while the pit density of the wafer of the present invention was about $1 \times 10^4$ number/cm$^2$ or more. Namely, the wafer having sufficient IG effect even when oxygen concentration is low can be produced by the method of the present invention.

Example 2

Comparative Example 2

In accordance with CZ method, polycrystalline material of silicon was charged into a quartz crucible having a diameter of 18 inches, twelve single crystal ingots of p-type having a diameter of 8 inches, crystal orientation <100> and resistiviy of 10 Ω·cm were pulled with varying the doping amount of nitrogen, the oxygen concentration and the cooling rate.

The doping amount of nitrogen was controlled by charging silicon wafer having silicon nitride film previously in a predetermined amount. The oxygen concentration was controlled by controlling the number of rotation of the crucible. The cooling rate was controlled by varying the pulling rate of the single crystal ingot to vary a growth rate of the crystal.

The wafers were sliced from the single crystal ingot thus obtained with a wire saw, and subjected to chamfering, lapping, etching, and mirror polishing. All of them were produced in almost the same condition except the doping amount of nitrogen, the oxygen concentration and the cooling rate. Twelve kinds of silicon single crystal mirror polished wafers having a diameter of 8 inches were produced plurally each.

The silicon single crystal wafer thus obtained was subjected to gettering heat treatment. The gettering heat treatment is conducted by heating the silicon single crystal wafer to 1200° C. at a rate of elevating temperature of 6° C./min in an atmosphere of 50% hydrogen and 50% argon, and keeping it at 1200° C. for 60 minutes, and cooling it at a rate of decreasing temperature of 3° C./min.

Then, twelve kinds of silicon single crystal wafers thus obtained were evaluated as for the depth of denuded zone. Evaluation of the depth of denuded zone was conducted as follows. The surface of the wafers were polished to prepare the wafers each polished at a different stock removal. Then, the wafer was cleaned with SC-1 mixed solution (a mixed solution of aqueous ammonia ($NH_4OH$) and hydrogen hydroperoxide ($H_2O_2$) and super pure water in 1:1:20) at 80° C. for one hour to reveal fine COP (Crystal Originated Particle) and a number of COP having a size of 0.10 $\mu$m or more on the surface of the wafer was measured by counting the number of COP with SP1 particle counter manufactured by KLA/Tencor. Polishing was conducted so that stock removal is increased every 1 $\mu$m to 12 $\mu$m.

Then, the depth of denuded zone was also appreciated by evaluating oxide dielectric breakdown voltage characteristics of wafers each polished at a different stock removal as described above. The oxide dielectric breakdown voltage characteristics was evaluated by C-mode yield of TZDB (Time Zero Dielectric Breakdown), more specifically by manufacturing a phosphorus doped polysilicon electrode (thickness of the oxide film: 25 nm, electrode for measurement: phosphorus doped polysilicon, electrode area: 8 $mm^2$), and evaluating at electric current density in decision of 1 $mA/cm^2$. The wafer having dielectric breakdown electric field of 8 MV/cm or more is defined as a good chip. The good chip yield in the case that measurement is conducted with one hundred electrodes on the surface of the wafer is defined as C-mode good chip yield.

γ-mode yield of TDDB (Time Dependent Dielectric Breakdown) was also evaluated. It is conducted by manufacturing a phosphorus doped polysilicon electrode (thickness of the oxide film: 25 nm, electrode area: 4 $mm^2$), and sending stress electric current of 0.01 $mA/cm^2$. The wafer wherein dielectric breakdown occurs at a charge amount of 25 $C/cm^2$ or more was evaluated to be a good chip. The good chip yield in the case that measurement is conducted with one hundred electrodes on the surface of the wafer is defined as γ-mode good chip yield.

When the good chip yield is 90% or more in evaluation of both TZDB and TDDB, it was defined as the denuded zone.

Thereafter, these twelve kinds of silicon single crystal wafers were subjected to the heat treatment which is similar to a device heat treatment. The heat treatment was carried out by subjecting the silicon single crystal wafer to the heat treatment at 800° C. in an atmosphere of nitrogen for 4 hours and then oxidizing heat treatment at 1000° C. for 16 hours.

Then, these twelve kinds of silicon single crystal wafers were evaluated as for the bulk micro-defect density. The bulk micro-defect density was measured by OPP (Optical Precipitate Profiler) method. The OPP method is an applied method of Normalski type differential interference microscope. In the method, laser beam from light source is separated to two orthogonal polarized straight beams of which phases are 90 degree different from each other through use of a polarizing prism, which then enter the wafer from the side of mirror polished surface. At this time, when one of the beams crosses a defect, phase shift occurs to form phase contrast with the other beam. The defect is detected by detecting the phase contrast with a polarization analyzer after the beams transmit from the back surface of the wafer.

The results thus obtained are shown in Table 1. Evaluation of the depth of denuded zone was conducted as follows. The depth at which the number of COP in the surface of the wafer is less than 100 was defined as the depth of denuded zone in the evaluation according to the number of COP, and the depth at which the good chip yield is 90% or more was defined as the depth of denuded zone, in the evaluation according to oxide dielectric breakdown voltage characteristics.

TABLE 1

| | | | Depth of denuded zone ($\mu$m) | | |
|---|---|---|---|---|---|
| Nitrogen Concentration (atoms/$cm^3$) | Cooling Rate (° C./min) | Oxygen Concentration (ppma:JEIDA) | Evaluation by number of COP | Evaluation by oxide dielectric breakdown voltage | Bulk micro-defect density (number/$cm^3$) |
| $3 \times 10^{14}$ | 2.3 | 10 | 12 | 12 | $1 \times 10^9$ |
| | | 14 | 6 | 6 | $8 \times 10^9$ |
| | | 16 | 2 | 3 | $9 \times 10^9$ |
| | 3.5 | 10 | 12 | 12 | $2 \times 10^9$ |
| | | 14 | 12 | 7 | $9 \times 10^9$ |
| | | 16 | 12 | 5 | $1 \times 10^{10}$ |
| $3 \times 10^{13}$ | 2.3 | 14 | 2 | 3 | $1 \times 10^9$ |
| | 3.5 | 12 | 9 | 6 | $3 \times 10^9$ |

TABLE 1-continued

| Nitrogen Concentration (atoms/cm$^3$) | Cooling Rate (° C./min) | Oxygen Concentration (ppma:JEIDA) | Depth of denuded zone ($\mu$m) Evaluation by number of COP | Depth of denuded zone ($\mu$m) Evaluation by oxide dielectric breakdown voltage | Bulk micro-defect density (number/cm$^3$) |
|---|---|---|---|---|---|
| | | 16 | 6 | 3 | 9 × 10$^9$ |
| 2 × 10$^{12}$ | 3.5 | 12 | 7 | 3 | 7 × 10$^8$ |
| none | 2.3 | 14 | 0.3 | 0.5 | 2 × 10$^8$ |
| | 3.5 | 10 | 0.1 | 0.5 | 5 × 10$^7$ |

Table 1 shows that the depth of denuded zone and the bulk micro-defect density of the wafer produced from the single crystal grown with controlling nitrogen concentration according to the present invention are improved significantly compared to the conventional wafer produced with controlling only oxygen concentration and cooling rate. The lower value between the depth of denuded zone evaluated by the number of COP and that evaluated by the oxide dielectric breakdown voltage was defined to be the depth of denuded zone, and plotted in FIG. 3. FIG. 3 shows that the controllable range of the depth of denuded zone and the bulk micro-defect density of the wafer of the present invention produced in Example is far enlarged compared to that of the conventional wafer produced in Comparative Example.

The present invention is not limited to the above-described embodiment. The above-described embodiment is a mere example, and those having the substantially same structure as that described in the appended claims and providing the similar action and effects are included in the scope of the present invention.

For example, when silicon single crystal ingot in which nitrogen is doped is grown by Czochralski method, a magnetic field may be applied to a melt or not. In the specification of the present invention, the term of Czochralski method also means so-called MCZ method wherein a magnetic field is applied.

Furthermore, although it was shown above that lower density of crystal defect can be achieved when oxygen concentration is low, the present invention is not limited thereto, and can achieve the effect even when oxygen concentration is high as 1.2 to 1.5×10$^{18}$ atoms/cm$^3$ (15 to 17 ppma:JEIDA), or more.

The gettering heat treatment and the device fabricating heat treatment described above are also mere examples. They can be appropriately modified depending on a mode of a device to be fabricated or the like.

What is claimed is:

1. A method for producing a silicon single crystal wafer wherein a silicon single crystal ingot in which nitrogen is doped is grown by Czochralski method, the single crystal ingot is sliced to provide a silicon single crystal wafer, and then the silicon single crystal wafer is subjected to heat treatment in an atmosphere of hydrogen, argon or a mixed atmosphere thereof to out-diffuse nitrogen on the surface of the wafer.

2. The method for producing a silicon single crystal wafer according to claim 1 wherein concentration of nitrogen doped in a single crystal ingot is 1×10$^{10}$ to 5×10$^{15}$ atoms/cm$^3$ when a silicon single crystal ingot in which nitrogen is doped is grown by Czochralski method.

3. The method for producing a silicon single crystal wafer according to claim 1 wherein oxygen concentration in the single crystal ingot is 1.2×10$^{18}$ atoms/cm$^3$ or less when a silicon single crystal ingot in which nitrogen is doped is grown by Czochralski method.

4. The method for producing a silicon single crystal wafer according to claim 1 wherein the heat treatment for out-diffusing nitrogen on the surface of the wafer is conducted at a temperature of 900° C. to a melting point of silicon.

5. A method for producing a silicon single crystal wafer wherein a silicon single crystal ingot is produced by growing a silicon single crystal ingot in which nitrogen is doped by Czochralski method with controlling nitrogen concentration, oxygen concentration and cooling rate, and then the silicon single crystal ingot is sliced to provide a wafer.

6. The method for producing a silicon single crystal wafer according to claim 5 wherein concentration of nitrogen doped in a single crystal ingot is 1×10$^{12}$ to 2×10$^{15}$ atoms/cm$^3$ when a silicon single crystal ingot in which nitrogen is doped is grown by Czochralski method.

7. The method for producing a silicon single crystal wafer according to claim 5 wherein oxygen concentration contained in the single crystal ingot is controlled to be in the range of 9 to 17 ppma when a silicon single crystal ingot in which nitrogen is doped is grown by Czochralski method.

8. The method for producing a silicon single crystal wafer according to claim 5 wherein the rate of cooling from 1150° C. to 1080° C. is controlled to be in the range of from 1.0 to 4.5° C./min when a silicon single crystal ingot in which nitrogen is doped is grown by Czochralski method.

9. A silicon single crystal wafer produced by a method of claim 1.

10. A silicon single crystal wafer produced by a method of claim 5.

11. A silicon single crystal wafer produced by slicing a silicon single crystal ingot grown by Czochralski method with doping nitrogen wherein nitrogen on the surface of the silicon single crystal wafer is out-diffused by heat treatment in an atmosphere of hydrogen, argon or a mixed atmosphere thereof.

12. The silicon single crystal wafer according to claim 11 wherein concentration of nitrogen doped in the silicon single crystal wafer is 1×10$^{10}$ to 5×10$^{15}$ atoms/cm$^3$.

13. The silicon single crystal wafer according to claim 11 wherein oxygen concentration in the silicon single crystal wafer is 1.2×10$^{18}$ atoms/cm$^3$ or less.

14. The silicon single crystal wafer according to claim 11 wherein the heat treatment for out-diffusing nitrogen on the surface of the wafer is conducted at a temperature of 900° C. to a melting point of silicon.

15. The silicon single crystal wafer according to claim 11 wherein the density of the crystal defects on the surface of the wafer is 30 number/cm$^2$ or less.

16. A silicon single crystal wafer obtained by slicing a silicon single crystal ingot grown by Czochralski method with doping nitrogen wherein depth of denuded zone after gettering heat treatment or device fabricating heat treatment is 2 to 12 μm, and bulk micro-defect density after gettering heat treatment or device fabricating heat treatment is $1\times10^8$ to $2\times10^{10}$ number/cm$^3$.

17. The silicon single crystal wafer according to claim 16 wherein nitrogen concentration in the silicon single crystal wafer is $1\times10^{12}$ to $1\times10^{15}$ atoms/cm$^3$.

18. The silicon single crystal wafer according to claim 16 wherein oxygen concentration in the silicon single crystal wafer is 9 to 17 ppma.

19. The silicon single crystal wafer according to claim 16 wherein the silicon single crystal ingot is grown with controlling the rate of cooling from 1150° C. to 1080° C. during growth of crystal to be in the range of from 1.0 to 4.5° C./min.

* * * * *